(12) United States Patent
Ban et al.

(10) Patent No.: US 8,106,408 B2
(45) Date of Patent: Jan. 31, 2012

(54) OPTICAL SEMICONDUCTOR DEVICE WITH FLEXIBLE SUBSTRATE

(75) Inventors: Takuma Ban, Kamakura (JP);
Michihide Sasada, Yokosuka (JP);
Masanobu Okayasu, Yokohama (JP)

(73) Assignee: Opnext Japan, Inc., Yokohama-shi (JP)

( * ) Notice: Subject to any disclaimer, the term of this patent is extended or adjusted under 35 U.S.C. 154(b) by 87 days.

(21) Appl. No.: 12/484,196

(22) Filed: Jun. 13, 2009

(65) Prior Publication Data

US 2010/0006863 A1 Jan. 14, 2010

(30) Foreign Application Priority Data

Jun. 17, 2008 (JP) ................................. 2008-157602

(51) Int. Cl.
*H01L 31/12* (2006.01)
(52) U.S. Cl. ..................... 257/81; 257/E23.19; 174/254
(58) Field of Classification Search .................. 174/254, 174/255, 260; 257/81, E23.19, E23.193, 257/E33.066, E33.076; 361/749
See application file for complete search history.

(56) References Cited

U.S. PATENT DOCUMENTS

| 7,439,449 B1* | 10/2008 | Kumar et al. ................. 174/254 |
| 2005/0045374 A1* | 3/2005 | Kumar et al. ................. 174/254 |
| 2007/0058980 A1 | 3/2007 | Hidaka |

FOREIGN PATENT DOCUMENTS

| JP | 2006-80418 A | 3/2006 |
| JP | 2007-42756 A | 2/2007 |
| JP | 2007-43496 A | 2/2007 |

* cited by examiner

*Primary Examiner* — Thomas L Dickey
(74) *Attorney, Agent, or Firm* — Miles & Stockbridge P.C.

(57) ABSTRACT

A metal pattern for a high frequency signal is patterned on a flexile substrate, and the flexile substrate is bent in such a way as to form a substantially right angle at a spot corresponding to an end of the metal pattern for the signal. And an end of the metal pattern is fixedly attached to a lead pin for signaling, attached to a stem, for electrical continuity, so as to be in a posture horizontal with each other. Meanwhile, a part of the lead pins attached to the stem, being in such a state as penetrated through respective holes provided in the flexible substrate, is fixedly attached to a part of metal patterns provided on the flexible substrate so as to ensure electrical continuity therebetween.

22 Claims, 16 Drawing Sheets

B—B'

C—C'

OPTICAL SEMICONDUCTOR DEVICE WITH FLEXIBLE SUBSTRATE

CLAIM OF PRIORITY

The present application claims priority from Japanese patent application JP 2008-157602, filed on Jun. 17, 2008, the content of which is hereby incorporated by reference into this application.

FIELD OF THE INVENTION

The invention relates to an optical semiconductor device encased in an optical transceiver that is used by taking advantage of an optical communication technology, and in particular, to an optical semiconductor device wherein a CAN type optical package, and a flexible substrate are joined with each other.

BACKGROUND OF THE INVENTION

In optical communication, an important role is played by an optical transceiver for transmitting and receiving an optical signal, and an optical fiber serving as a medium for transmission of the optical signal, respectively. An optical semiconductor device for converting an electric signal into an optical signal, and vice versa, and a printed wiring board with electronic elements for control, electrical connectors, and so forth, mounted thereon, are encased in a box of an optical transceiver.

Typical embodiments of an optical semiconductor device are disclosed in Japanese Patent Application Laid-Open Publication No. 2007-43496, Japanese Patent Application Laid-Open Publication No. 2007-42756, Japanese Patent Application Laid-Open Publication NO. 2006-80418, and so forth, respectively. The optical semiconductor device is comprised of a CAN type optical package with optical elements capable of optic-electronic conversion, such as a laser (light transmission element), and a photodiode (light-sensitive element), mounted therein, and a flexible substrate. Such a makeup of the optical semiconductor device is often used in an optical transceiver capable of coping with a transmission speed in a range of about several hundred Mbps to 10 Gbps.

According to conventional examples described as above, the following method is adopted as a method for joining the CAN type optical package with the flexible substrate. It is a method whereby the flexible substrate having holes is fitted over lead pins protruding from the rear surface of the CAN type optical package, and the lead pins each are fixedly attached to part of the flexible substrate, around each of the holes. As is so often the case, the lead pins each are generally a terminal for grounding, power supply, and signal, and the lead pins are fixedly attached to a metal pattern provided on the flexible substrate, ensuring electrically continuity therebetween by soldering. Since the lead pins of the CAN type optical package are inserted in the holes of the flexible substrate, respectively, connection therebetween is solid, and highly resistant to stress due to a change in temperature and humidity, and mechanical pressure, so that the optical semiconductor device has the advantage in that its reliability as a product is high.

SUMMARY OF THE INVENTION

In recent years, however, a transmission speed in excess of 10 Gbps, that is, a transmission speed on the order of 25 Gbps, or 40 Gbps has come to be required of an optical transceiver, so that drawbacks of the conventional optical semiconductor device have since become so pronounced that the same is no longer applicable to the optical transceiver. The drawbacks are described hereinafter. A signal lead pin of the CAN type optical package is connected to a signal metal pattern of the flexible substrate in such a way as to be substantially normal thereto. A mismatch in characteristic impedance is prone to occur to each spot where an optical transmission line is abruptly bent, thereby inducing reflection of a high frequency signal.

Since the reflection of the high frequency signal will not only induce deterioration in transmission waveform but also cause the high-frequency signal to be radiated as a noise inside the box of the optical transceiver to thereby induce an erroneous operation of the optical transceiver. The reflection of the high-frequency signal, therefore, need be sufficiently reduced.

It is therefore an object of the invention to provide an optical semiconductor device using a CAN type optical package, wherein a flexible substrate, and a CAN type optical package are solidly joined with each other, the optical semiconductor device being excellent in high-frequency characteristics because reflection of a high frequency signal, occurring to joints, is reduced while maintaining its reliability as a product.

The present invention relates to a structure for connecting a CAN type optical package provided with a plurality of lead pins extending from a stem, arranged along a vertical direction, to a flexible substrate on which a metal pattern is patterned in order to fixedly attach the lead pins to the flexible substrate, ensuring electrical continuity therebetween.

The flexible substrate is bent at its spot corresponding to an end of a signal metal pattern on the flexible substrate to the extent that a substantially right angle is formed. And at least a signal lead pin, among the lead pins attached to the stem, is fixedly attached to a signal electrical pattern on the flexible substrate so as to be in a posture substantially horizontal with each other, ensuring electrical continuity therebetween.

On the other hand, a part of the lead pins attached to the stem, being in such a state as penetrated through each hole provided in the flexible substrate, is fixedly attached to respective electrical patterns on the flexible substrate so as to ensure electrical continuity therebetween.

Now, in FIG. 26, there are shown results of characteristics comparison by electromagnetic field computation in order to compare characteristics of a conventional case with that of the present invention. In the figure, the horizontal axis indicates frequency and the vertical axis indicates reflection loss. It is evident that with the present structure according to the present invention, there was seen an improvement (reduction) in reflection loss as much as not less than 15 dB against frequency on the order of 20 GHz, and not less than 10 dB against frequency on the order of 30 GHz, as compared with the conventional case. FIGS. 27A, 27B each are a view for use in the electromagnetic field computation of the characteristics of the present structure. FIGS. 27A, 27B each are a sectional view of an identical structure. Condition on which the electromagnetic field computation was conducted is as follows. For an insulator 112, use was made of a glass material (dielectric constant: 5.5). First lead pins 103 each were 200 μm in diameter, and about 500Ω in characteristic impedance. The first lead pins 103 were joined and fixed to first metal patterns 105, respectively, with solder 117. The first lead pin 103 positioned at the center of three lengths of the first lead pins 103 connected to a stem 102 was for use in signaling while the remaining two lengths thereof were for use as a grounding line. A grounding metal pattern 301 on the rear surface of a flexile substrate 107 was connected to a first grounding metal pattern 105 on the top surface of the flexile substrate 107 via respective through-holes 108. The flexile substrate 107 was made up of a polyimide material (dielectric constant: 3.5), and was 100 μm in thickness. The first grounding metal pattern 105 serving as a signal line was 200 μm wide, having characteristic impedance on the order of 50Ω. The electromagnetic field computation was conducted on the assumption that the stem 102 was 1 mm thick, and the first metal pattern 105 for signaling was 2 mm long.

With the present invention, part of the lead pins attached to the stem are fixedly attached to the respective electrical patterns, in such a state as penetrated through respective holes provided in the flexible substrate, so that the flexible substrate, and the CAN type optical package are solidly joined with each other. Meanwhile, because the lead pin for use in transmission of a high-frequency signal, and the metal pattern on the top of the flexible substrate are connected to each other in a posture substantially horizontal to each other, the present invention has an advantage in that reflection of the high-frequency signal is reduced.

DETAILED DESCRIPTION OF THE PREFERRED EMBODIMENTS

Embodiments of the invention are described hereinafter with reference to the accompanying drawings.

First Embodiment

Figure 1:
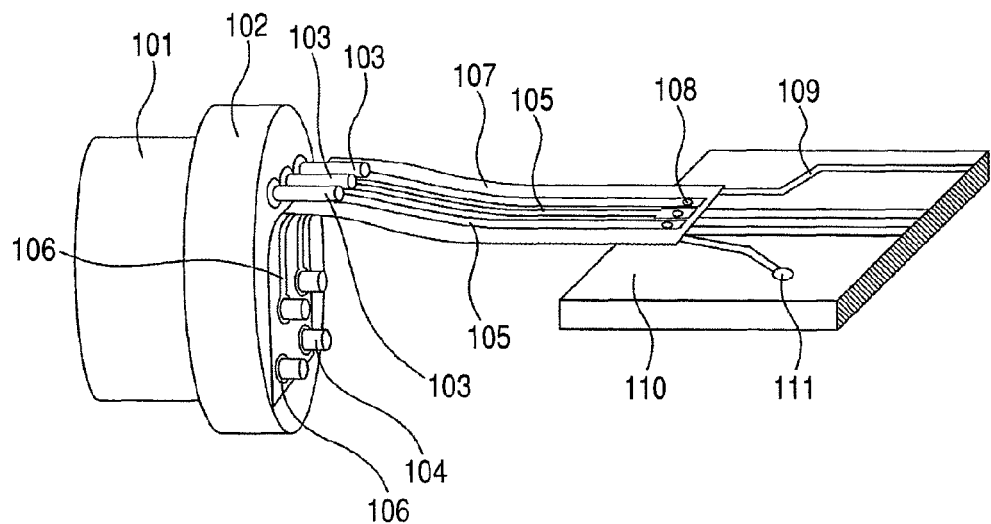
FIG. 1 is a perspective view showing a first embodiment of an optical semiconductor device according to the invention.
Figure 2:
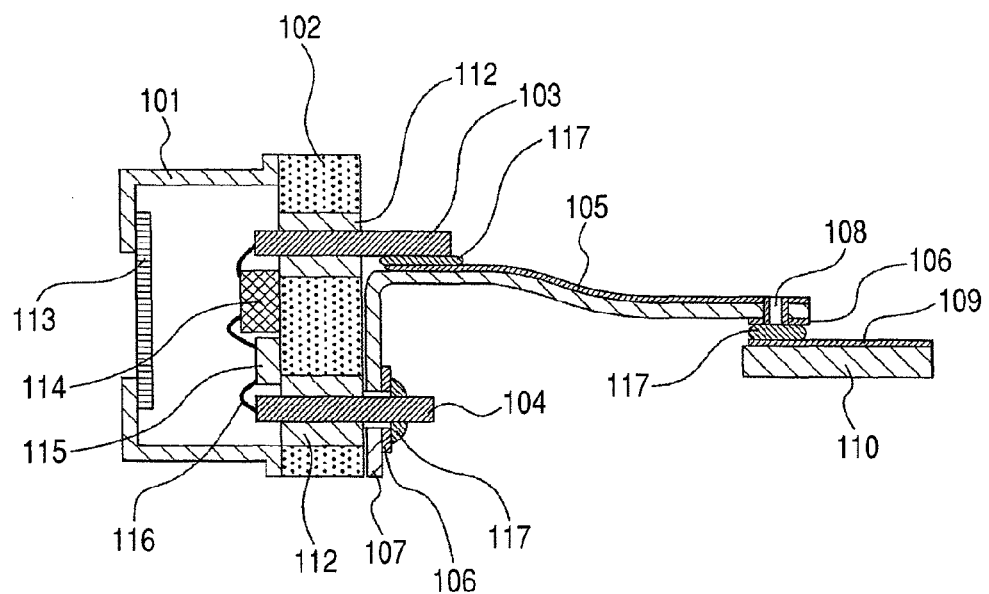
FIG. 2 is a sectional view showing the optical semiconductor device according to the first embodiment of the invention.

FIG. 1 is a perspective view schematically showing a first embodiment of an optical semiconductor device according to the invention, and a printed wiring board 110. The optical semiconductor device, and the printed wiring board 110 are components constituting an optical transceiver. FIG. 2 is a sectional view of the optical semiconductor device in FIG. 1, and FIG. 3 is a top view of a flexile substrate 107 only.

As shown in FIGS. 1 and 2, with a CAN type optical package, an optical element 115 is hermetically sealed with a lid 101 provided with a stem 102 and a window 113. An electronic element 114, and an optical element 115 are mounted on the stem 102, and wiring 116 is connected to respective spots where electrical connection is required, including first lead pins 103 and second lead pins 104, respectively. An insulator 112 is interposed between the stem 102 and each of the first lead pins 103 as well as each of the second lead pins 104. However, if a part of the lead pins is used for grounding, the insulator 112 is not necessarily required for such a lead pin, in which case, the lead pin may be attached directly to the stem 102. A high-frequency signal flows through the first lead pin 103. On the other hand, the second lead pin 104 is used for power supply to feed power to the optical element, however, besides the above, the second lead pin 104 may be used for grounding, for power supply to feed power to the electronic element 114, and for a signal for controlling the electronic element 114.

Figure 3:
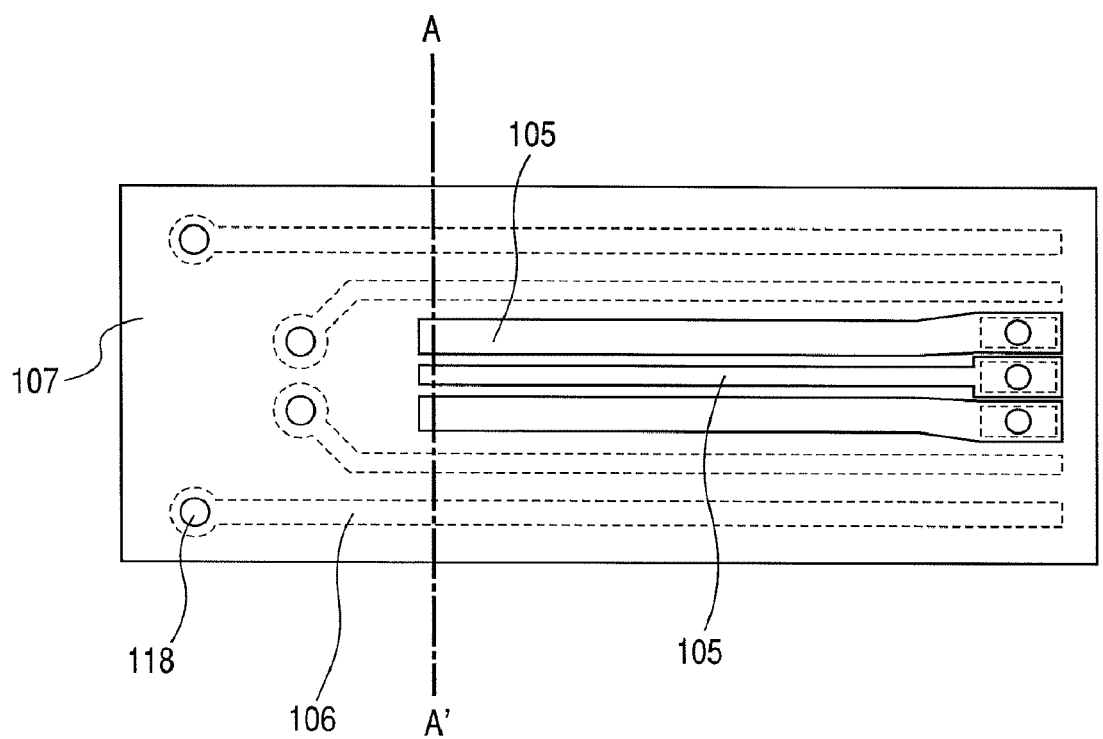
FIG. 3 is a top view showing a flexile substrate according to the first embodiment of the invention.

As shown in FIG. 3, first metal patterns 105 and second metal patterns 106 are patterned on the flexile substrate 107. In FIG. 3, metal patterns indicated by dotted lines are metal patterns that are patterned on the rear surface of the flexile substrate 107. The flexile substrate 107 is bent at a crease along line A-A' in the figure in such a way as to form a substantially right angle. And an end of each of the first metal patterns 105 is positioned in the vicinity of the crease along line A-A' to be fixedly attached to each of the first lead pins 103 with solder 117 to ensure electrical continuity therebetween. More specifically, because the first lead pin 103, and the first metal pattern 105 are attached to each other in a posture substantially horizontal, such a structure has an advantage of less reflection of a high frequency signal.

Now, the advantage of the present structure will be described from another angle hereinafter. In the optical transceiver, the first lead pin 103 and the printed wiring board 110 are often disposed in a posture substantially horizontal to each other. For this reason, with the optical semiconductor device wherein the first lead pin 103, and the first metal pattern 105 are attached to each other in the posture substantially horizontal to each other, and the first metal pattern 105, and a third metal pattern 109 are attached to each other in a posture substantially horizontal to each other, there is no need for bending the flexile substrate 107 into a large angle, so that there is an advantage in that the first metal patterns 105 each can be rendered short in wiring length. Such an advantage will be found pronounced particularly when a transmission speed of a signal is high, which will be described in more detail hereunder. In general, it is difficult to manufacture an optical semiconductor device such that characteristic impedance of the first metal pattern 105 for signal transmission completely matches that of the first lead pin 103 for signal transmission, and it is also difficult to manufacture the optical semiconductor device such that the characteristic impedance of the first metal pattern 105 for signal transmission completely matches that of the third metal pattern 109.

That is, the high frequency signal is more or less reflected at a discontinuity between those characteristic impedances, thereby causing resonance in a specific frequency to occur between two reflection points. A portion of a resonance signal is often ejected as a noise inside the optical transceiver, thereby creating a cause of inducing erroneous operation of other electronic components. It is known that a resonance frequency generally occurs at every half wavelength, that is, at a half wave, one wave, 3/2-wave, . . . In other words, there is an advantage in that the shorter in length the first metal pattern 105 for signal transmission is, the fewer will be the number of resonance points within a signal frequency range, so that it is easier to design the optical semiconductor device. With the optical semiconductor device for transmitting a signal at, for example, a transmission speed of 40 Gbps, the first metal pattern 105 for signal transmission is preferably not longer than 6 mm.

Now, reverting to FIGS. 1 and 2, the second lead pin 104 is penetrated through a first hole 118 provided in the flexile substrate 107 to be fixedly attached to the second metal pattern 106 with solder 117 for electrically continuity therebetween. In so doing, the flexile substrate 107 is solidly fixed to the CAN type optical package provided with the stem 102.

Further, if the flexile substrate 107 is actually bent at the crease along line A-A' such that a bending radius of a bend is on the order of 100 microns or less, this will often cause the second metal patterns 106 to be prone to rupture, and the crease therefore usually has a bending radius on the order of several hundred microns.

Further, the flexile substrate is not required to be bent at the crease along line A-A' so as to form an exactly right angle, and the object of the invention will be sufficiently achieved by bending of the flexile substrate in such a way as to form an angle of 90°±around 20°.

Second Embodiment

Figure 4:
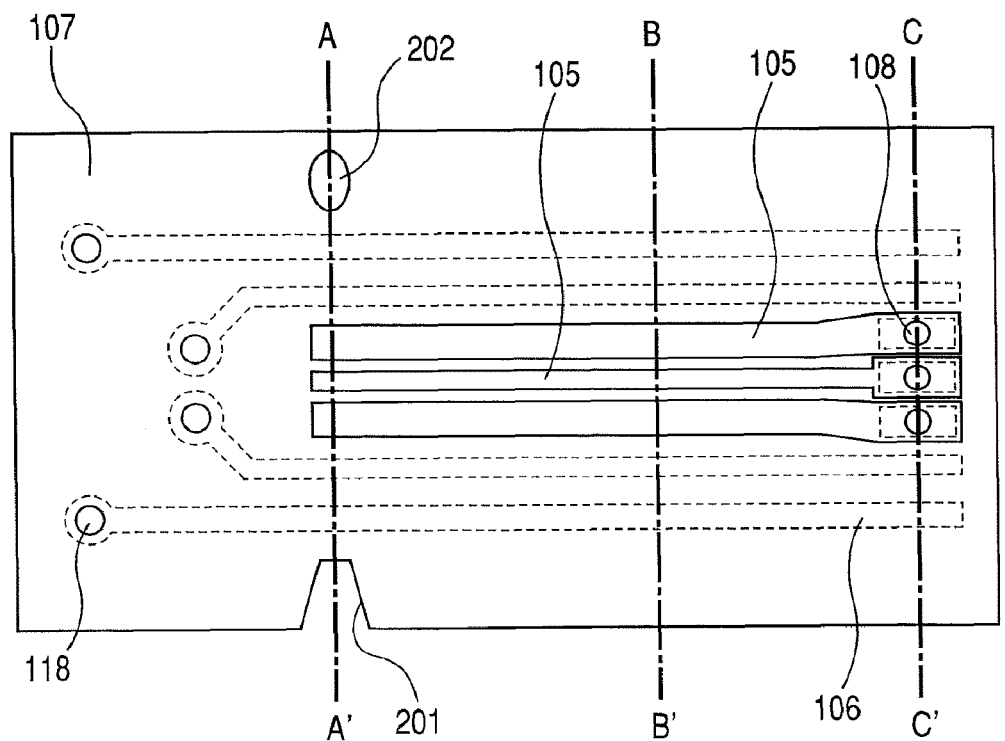
FIG. 4 is a top view showing a flexile substrate according to a second embodiment of the invention.
Figure 5:
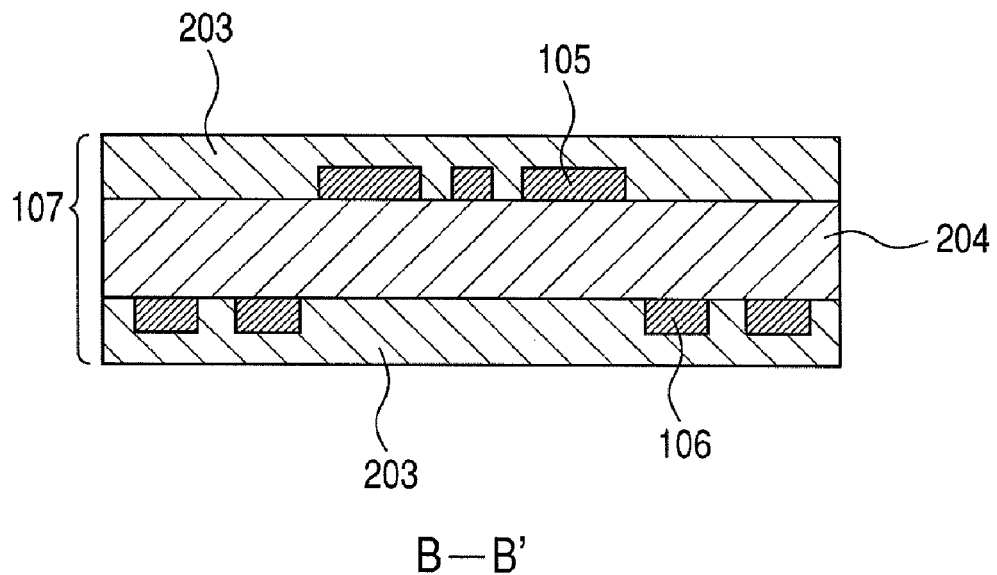
FIG. 5 is a sectional view of the flexile substrate according to the second embodiment of the invention.
Figure 6:
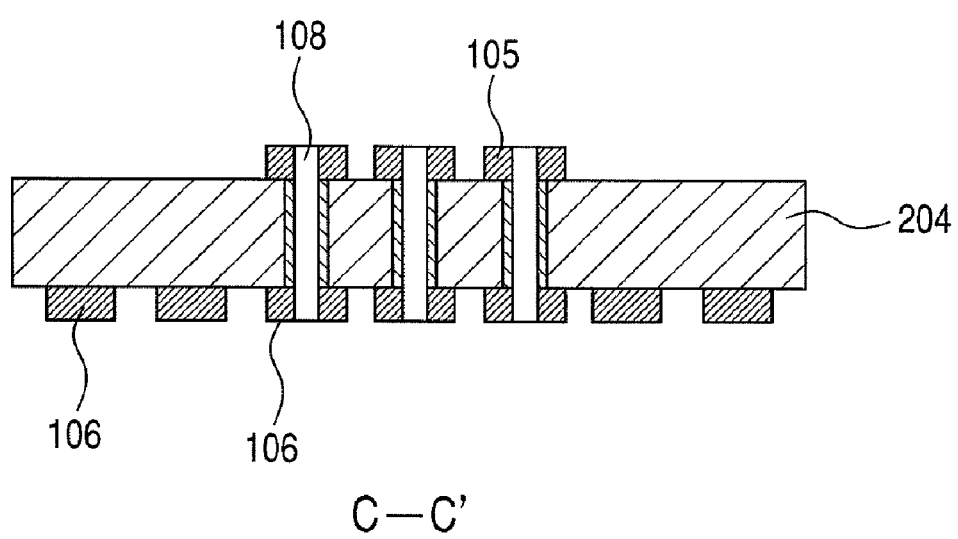
FIG. 6 is another sectional view of the flexile substrate according to the second embodiment of the invention.

FIG. 4 is a top view of a flexile substrate 107 of an optical semiconductor device according to a second embodiment of the invention. The optical semiconductor device has an advantage in that the flexible substrate 107 is bent at a crease along line A-A' in the figure, but the flexible substrate 107 can be bent with greater ease because the same is provided with a first notch 201 and a second hole 202. FIG. 5 is a sectional view of the flexile substrate 107, taken on line B-B' of FIG. 4, and FIG. 6 is a sectional view of the flexile substrate 107, taken on line C-C' of FIG. 4. With the flexile substrate 107, first metal patterns 105, and second metal patterns 106 are usually patterned on a base film 204, a resin layer 203 protecting the first metal patterns 105, and the second metal patterns 106, respectively. The base film 204, and the resin layer 203 each are composed of an organic matter such as resin including polyimide, and so forth. Further, a through-hole 108 with an inner wall metalized can be provided in the flexile substrate 107, thereby enabling the metal patterns on the top surface and the rear surface, respectively, to be electrically continuous with each other.

Third Embodiment

Figure 7:
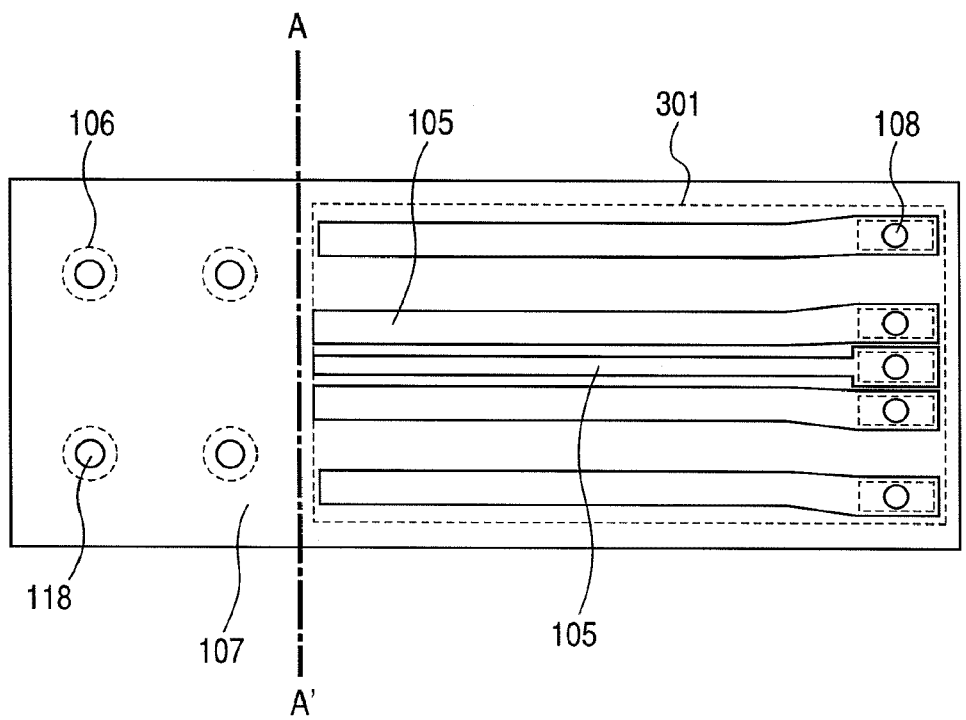
FIG. 7 is a top view of a flexile substrate according to a third embodiment of the invention.

FIG. 7 is a top view of a flexile substrate 107 of an optical semiconductor device according to a third embodiment of the invention. A metal pattern 301 for power supply or grounding, large in width, is patterned on the rear surface of the flexile substrate 107. Respective ends of first metal patterns 105, and an end of a metal pattern 301 for power supply or grounding are positioned in the vicinity of a crease along line A-A' in the figure. A constituent material of the flexile substrate 107 is generally softer than that of the metal patterns. For this reason, if the end of such a metal pattern large in width is positioned in the vicinity of the crease along line A-A', the flexile substrate 107 has an advantage in that it can be bent with greater ease.

Fourth Embodiment

Figure 8:
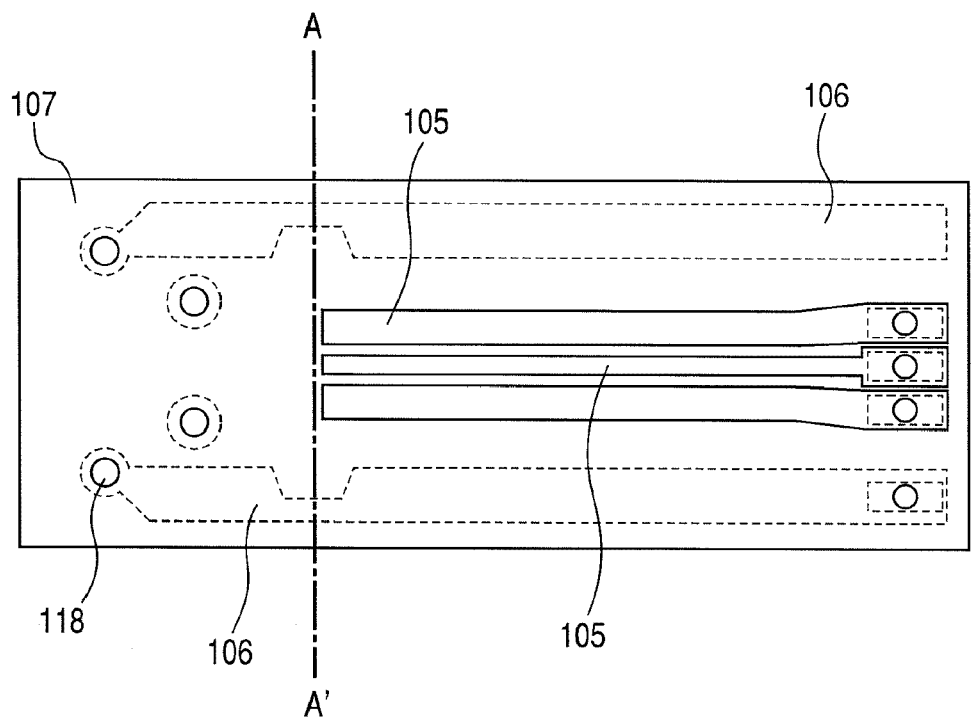
FIG. 8 is a top view of a flexile substrate according to a fourth embodiment of the invention.

FIG. 8 is a top view of a flexile substrate 107 of an optical semiconductor device according to a fourth embodiment of the invention. Second metal patterns 106, each having a narrower part at a spot where the flexible substrate is substantially vertically bent, is patterned on the rear surface of the flexile substrate 107. The narrower part of the second metal pattern 106 is positioned in the vicinity of a crease along line A-A' in the figure. A constituent material of the flexile substrate 107 is softer than that of the metal patterns. If the narrower part of the second metal pattern 106 is positioned in the vicinity of the crease along line A-A' as described, the flexile substrate 107 has an advantage in that it can be bent with greater ease.

Fifth Embodiment

Figure 9:
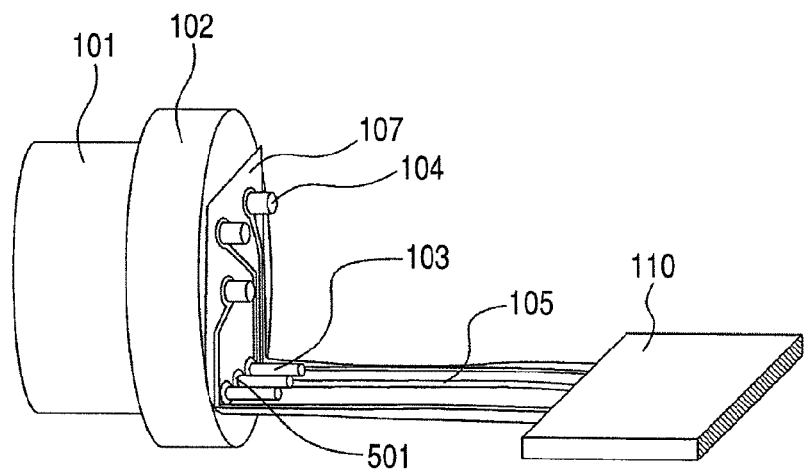
FIG. 9 is a perspective view of an optical semiconductor device according to a fifth embodiment of the invention.
Figure 10:
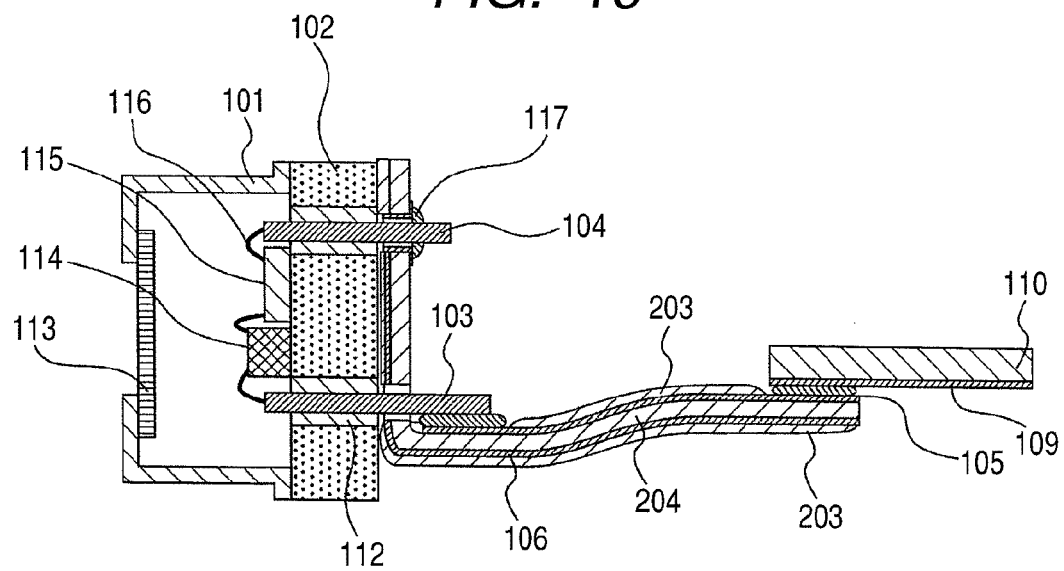
FIG. 10 is a sectional view of the optical semiconductor device according to the fifth embodiment of the invention.
Figure 11:
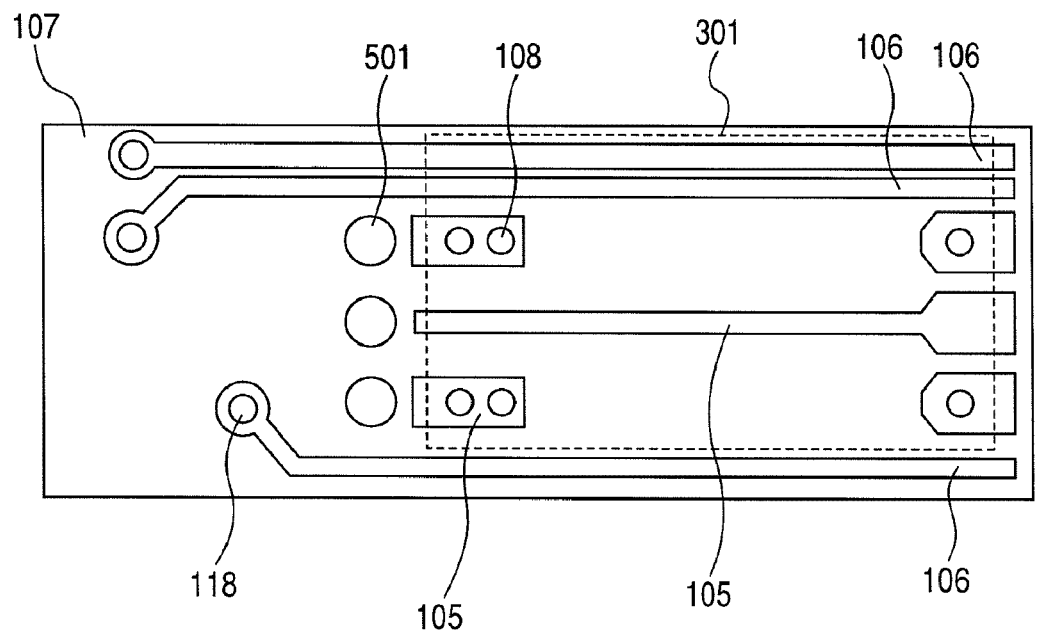
FIG. 11 is a top view of a flexile substrate according to the fifth embodiment of the invention.

FIG. 9 is a perspective view of an optical semiconductor device according to a fifth embodiment of the invention, FIG. 10 is a sectional view of the optical semiconductor device shown in FIG. 9, and FIG. 11 is a top view of a flexile substrate 107.

The flexile substrate 107 shown in FIG. 11 is provided with third holes 501. A first metal pattern 105 is provided so as to extend up to an edge of each of the third holes 501, and as shown in FIG. 9, the first metal pattern 105 is fixedly attached to each of first lead pins 103 for electrical continuity therebetween so as to be in a posture horizontal to each other, so that there is an advantage of propagation of a high-frequency signal with less reflection. Further, because the first lead pin 103 is penetrated through each of the third holes 501, the flexible substrate 107, and a stem 102 are more solidly joined with each other. Further, the first metal pattern 105, for use in grounding, is connected to a grounding metal pattern 301 on the rear surface of the flexible substrate 107 via a through-hole 108.

Figure 12:
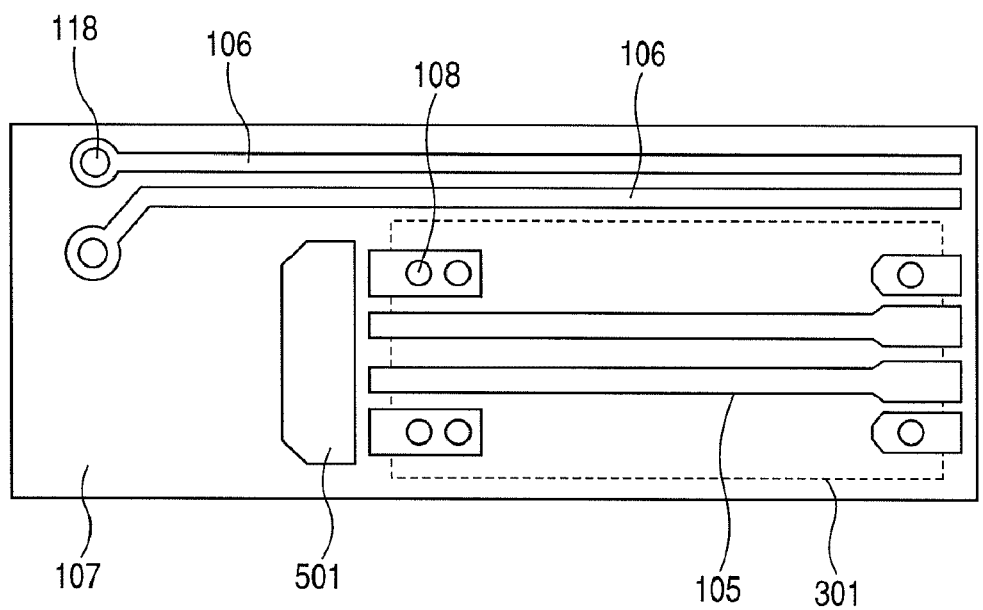
FIG. 12 is a top view of another flexile substrate according to the fifth embodiment of the invention.

In FIG. 12, there is shown another embodiment of a third hole 501. Plural lead pins 103, in a group, are penetrated through the third hole 501. In this case, since there is no need for drilling a plurality of the third holes 501 in the flexible substrate 107, there is an advantage in that the hole 501 can be made with greater ease.

Figure 13:
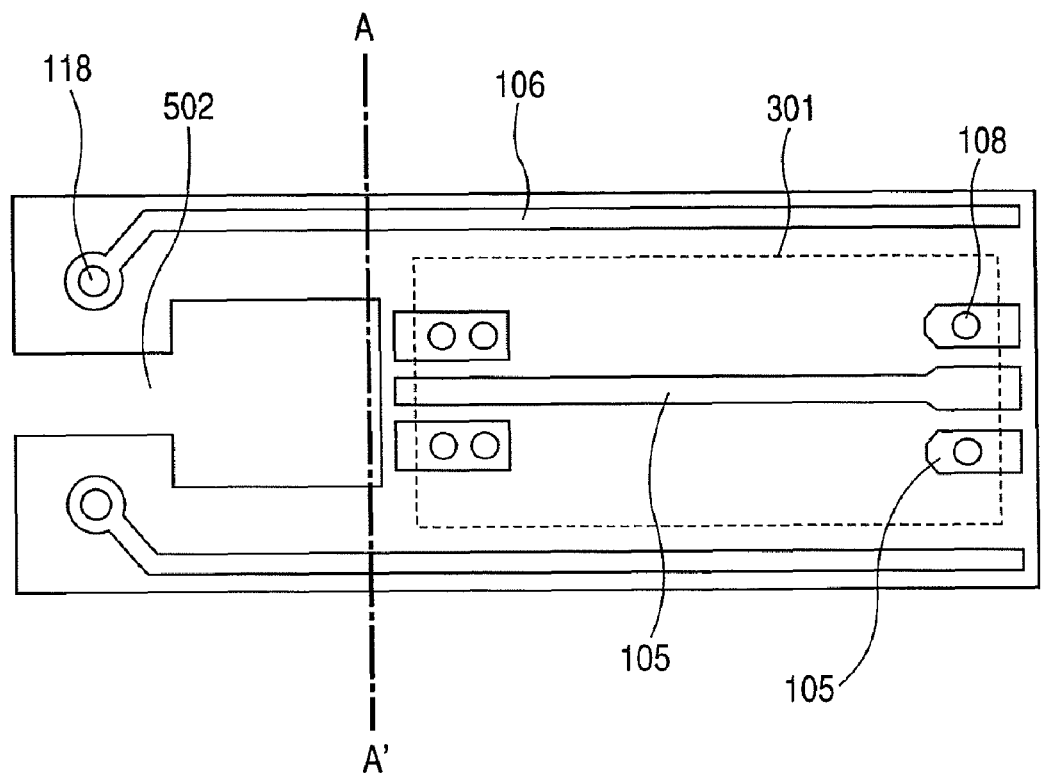
FIG. 13 is a top view of still another flexile substrate according to the fifth embodiment of the invention.

In FIG. 13, there is shown another embodiment of a flexible substrate 107. The flexible substrate 107 is provided with a second notch 502. In this case, the flexible substrate can be bent at a crease along line A-A' in the figure with greater ease. There is also gained an advantage in that two branches as divided from the flexible substrate can be bent in optional directions, respectively, for example, in staggered directions before being attached to a stem.

Sixth Embodiment

Figure 14:
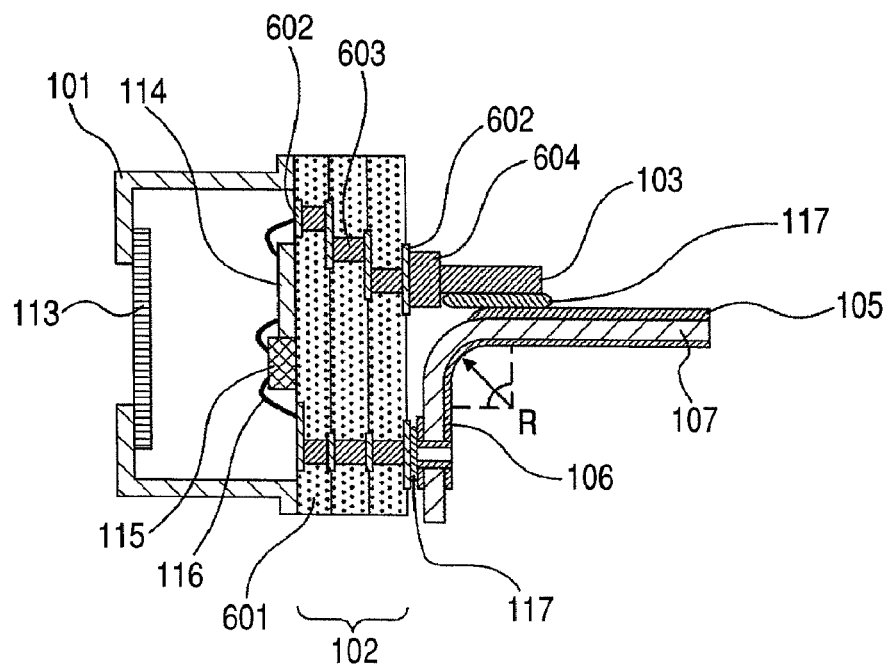
FIG. 14 is sectional view of an optical semiconductor device according to a sixth embodiment of the invention.

FIG. 14 is sectional view of an optical semiconductor device according to a sixth embodiment of the invention. With a CAN type optical package shown in FIG. 14, a stem 102 is comprised of ceramic layers 601 as stacked, and a fourth metal pattern 602 is patterned on internal faces as well as the respective surfaces of the stem 102 while via holes 603 are incorporated therein. The idea of the present invention is applicable to any CAN type optical package regardless of its constituent material, configuration, and shape provided that it is a CAN type optical package wherein first lead pins 103 are fixedly attached to the rear surface of the stem 102 in such a way as to be substantially perpendicular thereto, as described in the foregoing.

Reverting to FIG. 14, a second metal pattern 106 is fixedly attached to the fourth metal pattern 602 on the surface of the stem 102 through the intermediary of solder 117, ensuring electrical continuity therebetween. That is, a second lead pin 104 is not necessarily required, and if the metal patterns are fixedly attached with each other by soldering, or by use of an electrically conductive adhesive, this will sufficiently suit the purpose.

Further, reverting to FIG. 14, a root portion 604 of a first lead pin 103 is rendered larger in thickness than other parts thereof. The reason for this is as follows. When a flexible substrate 107 is bent, an actual bend thereof will have a curvature radius R (several hundred microns) as shown in the figure. More specifically, a gap is more or less opened between the root portion 604 of the first lead pin 103, and a first metal pattern 105. It is known that impedance of a transmission line in such a gap will increase, and reflection of a high frequency signal will be prone to be induced. Accordingly, with the present invention, the impedance is lowered on purpose by increasing the thickness of the root portion 604 of the first lead pin 103, thereby preventing an increase in impedance as a whole.

Seventh Embodiment

Figure 15:
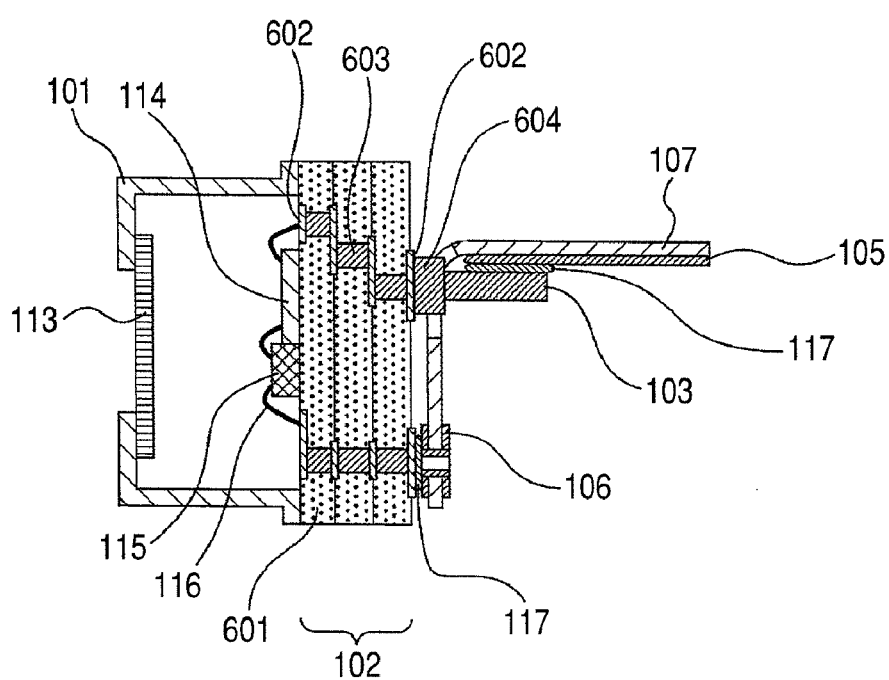
FIG. 15 is a sectional view of an optical semiconductor device according to a seventh embodiment of the invention.
Figure 16:
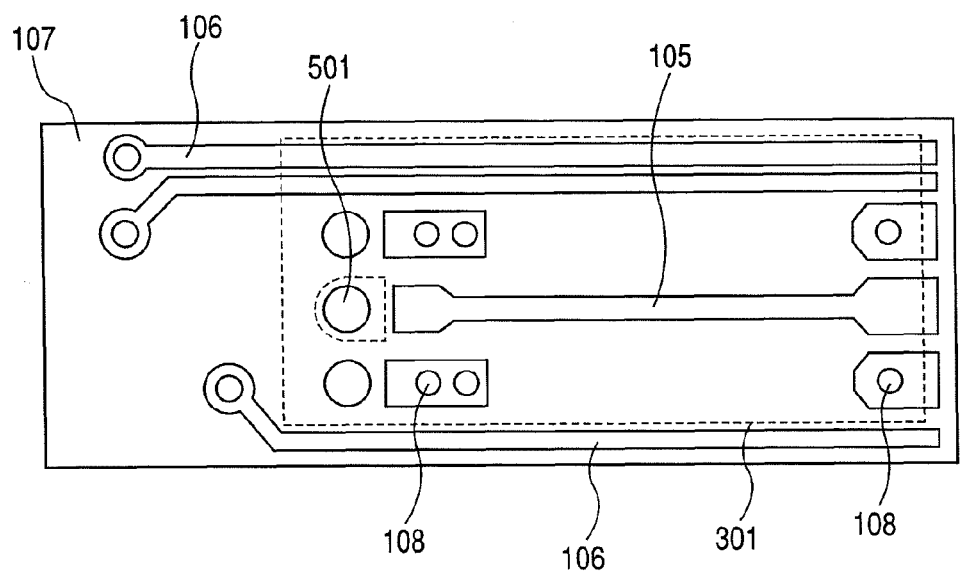
FIG. 16 is a top view of a flexile substrate according to the seventh embodiment of the invention.

FIG. 15 is a sectional view of an optical semiconductor device according to a seventh embodiment of the invention, and FIG. 16 is a top view of a flexile substrate 107. In the figure, the first lead pin 103 of the CAN type optical package shown in FIG. 14 is penetrated through a third hole 501. A first metal pattern 105 of the flexible substrate 107 is configured such that a portion of the first metal pattern 105, where the first lead pin 103 is fixedly attached thereto, is larger in diameter than the first lead pin 103 in order to reinforce a fixedly attached portion with solder 117.

Eighth Embodiment

Figure 17:
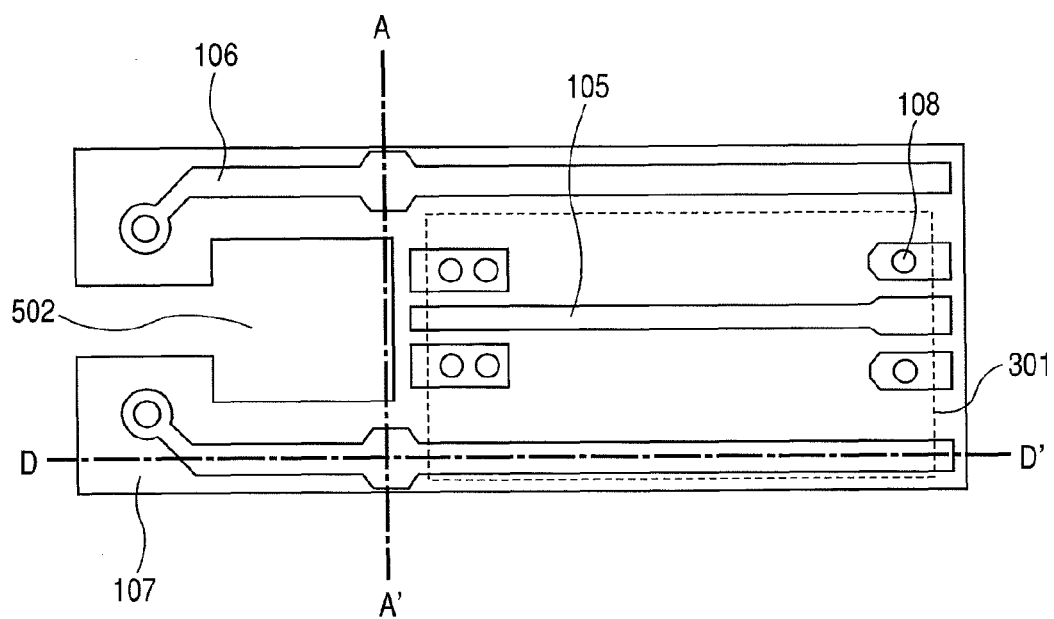
FIG. 17 is a top view of a flexile substrate according to an eighth embodiment of the invention.

FIG. 17 is a top view of a flexile substrate 107 of an optical semiconductor device according to an eighth embodiment of the invention. A portion of a second metal pattern 106 on the flexile substrate 107, in the vicinity of a spot along line A-A' in the figure, where the flexile substrate 107 is bent, is rendered larger in width. In this case, there is gained an advantage in that the second metal pattern 106 is less susceptible to a break.

Figure 18:
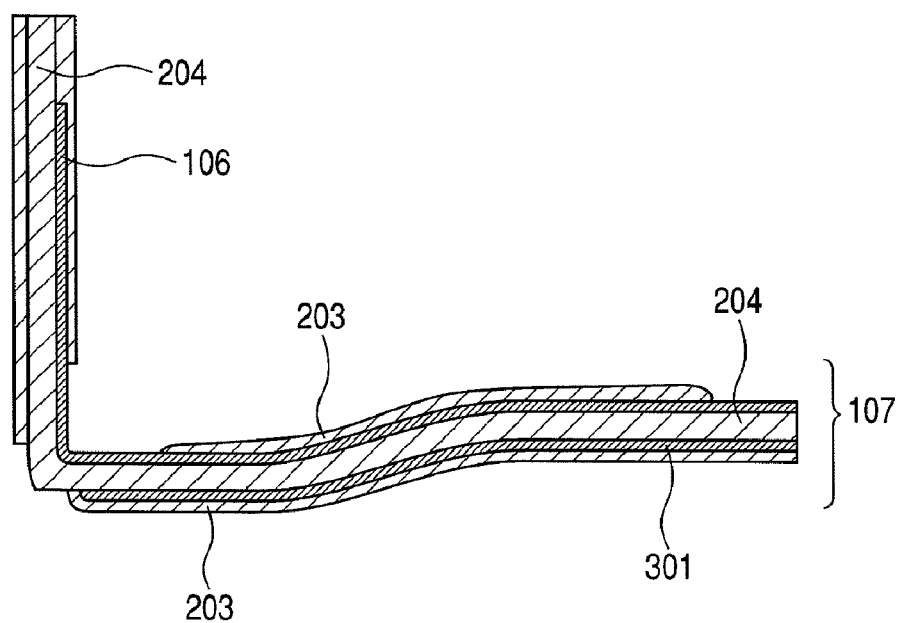
FIG. 18 is another sectional view showing the flexile substrate according to the eighth embodiment of the invention.

FIG. 18 is a sectional view showing the flexile substrate 107 shown in FIG. 17, taken on line D-D' in the figure, by way of example. A portion of a resin layer 23 on the top surface, or the rear surface of the flexile substrate 107, at the spot where the flexile substrate 107 is bent, may be removed. In this case, there is gained an advantage in that the flexile substrate 107 can be bent with greater ease. The resin layer 203 is composed of an organic material including resin and an adhesive.

Figure 19:
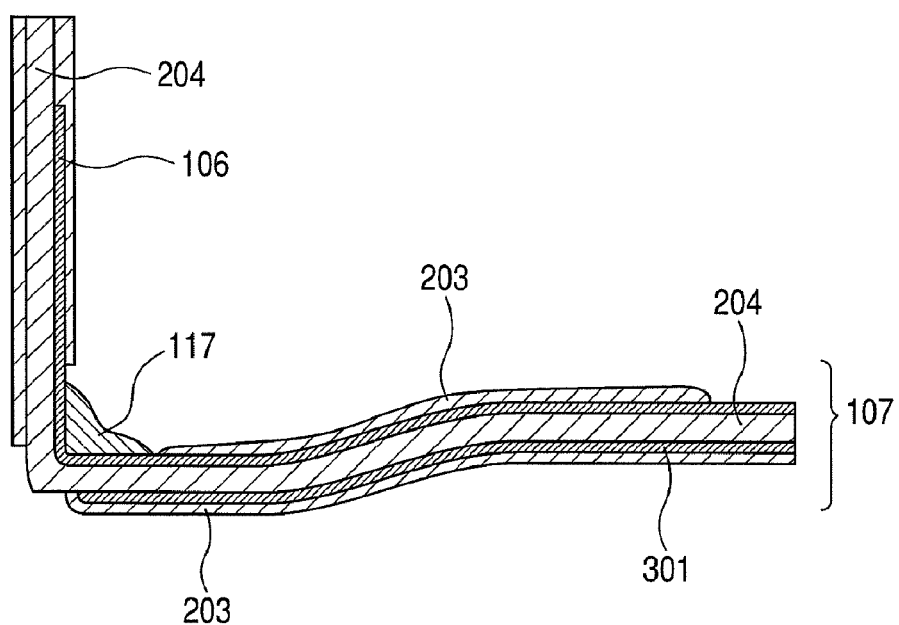
FIG. 19 is a sectional view showing another example of the flexile substrate according to the eighth embodiment of the invention.

FIG. 19 is a sectional view showing another example of the flexile substrate 107 shown in FIG. 18. This structure is suitable for use if there is the risk of the second metal pattern 106 undergoing rupture when the flexile substrate 107 is bent. Because portions of the resin layer 23 on the top surface are removed, it is possible to fixedly attach solder 117 on the top of the second metal pattern 106, thereby enabling the second metal pattern 106 to be reinforced.

Ninth Embodiment

Figure 20:
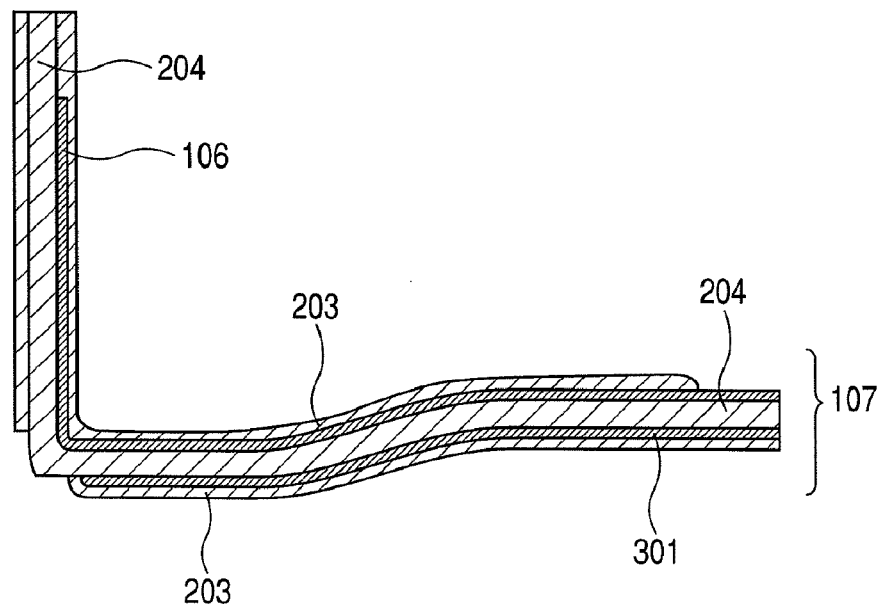
FIG. 20 is a sectional view showing a flexile substrate according to a ninth embodiment of the invention.

FIG. 20 is a sectional view showing another example of the flexile substrate 107 shown in FIG. 17, taken on line D-D' in the figure. Gold plating with the use of nickel for an undercoat is often applied to portions of a metal pattern, exposed to air, in order to prevent corrosion. However, a nickel-bearing material is low in ductility, and when a second metal pattern 106 is bent, this will often induce rupture of the metal pattern, thereby causing a problem. Accordingly, a resin layer 203 is attached to the surface of the second metal pattern 106, whereupon there is gained an advantage in that there is no necessity of applying gold plating with the use of nickel for the undercoat.

Tenth Embodiment

Figure 21:
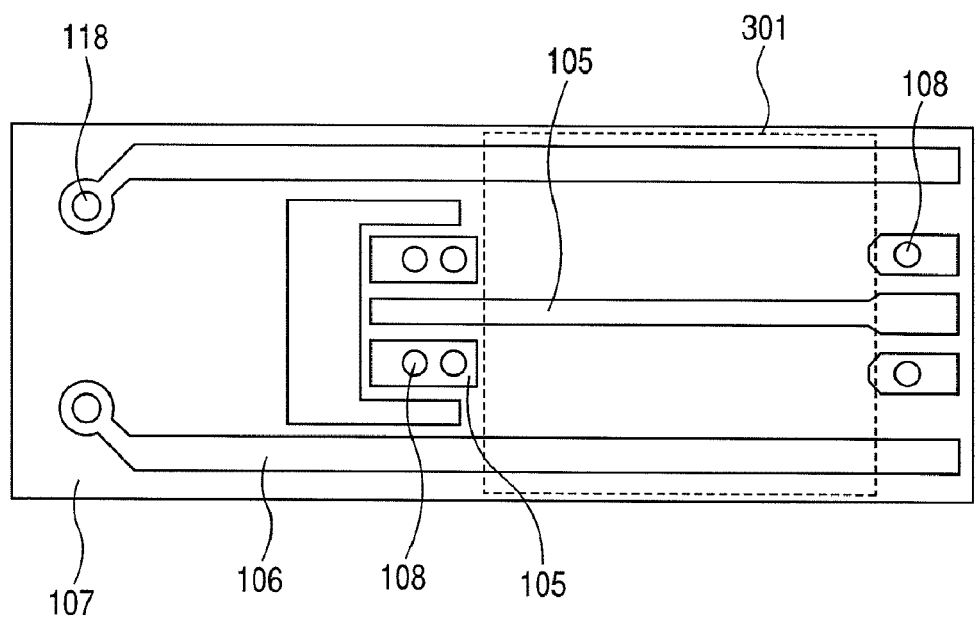
FIG. 21 is a top view of a flexile substrate according to a tenth embodiment of the invention.
Figure 22:
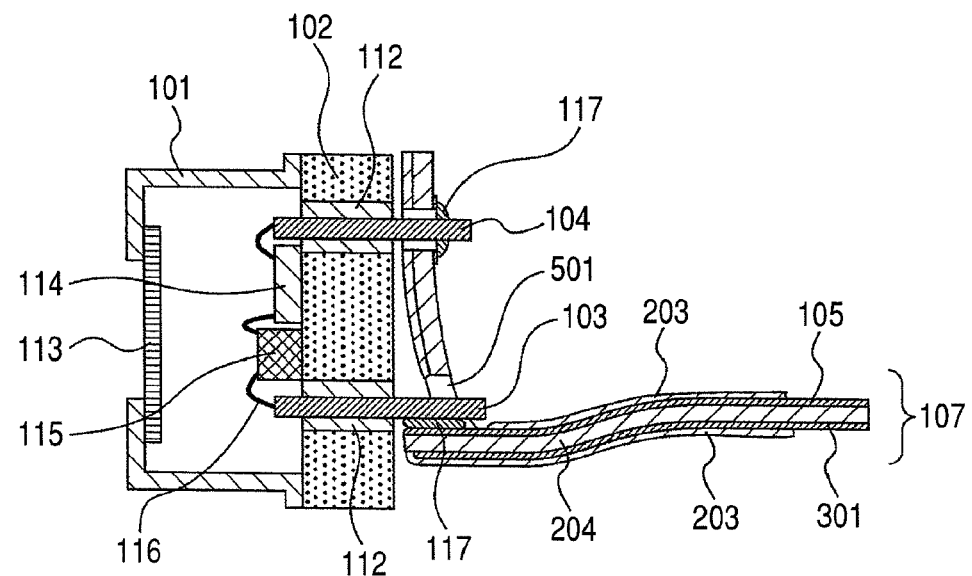
FIG. 22 is a sectional view of an optical semiconductor device according to the tenth embodiment of the invention.

FIG. 21 is a top view of a flexile substrate 107 of an optical semiconductor device according to a tenth embodiment of the invention. FIG. 22 is a sectional view of the optical semiconductor device using the flexile substrate 107 shown in FIG. 21. A third hole 501 is in such a shape as to surround a portion of each of first metal patterns 105 from three directions. In this case, even if an end of the first metal pattern 105 is caused to come close to the root portion of a first lead pin 103, this will not cause abrupt bending to occur to the flexile substrate 107. That is, there is gained an advantage in that a second metal pattern 106 is unsusceptible to rupture.

Figure 23:
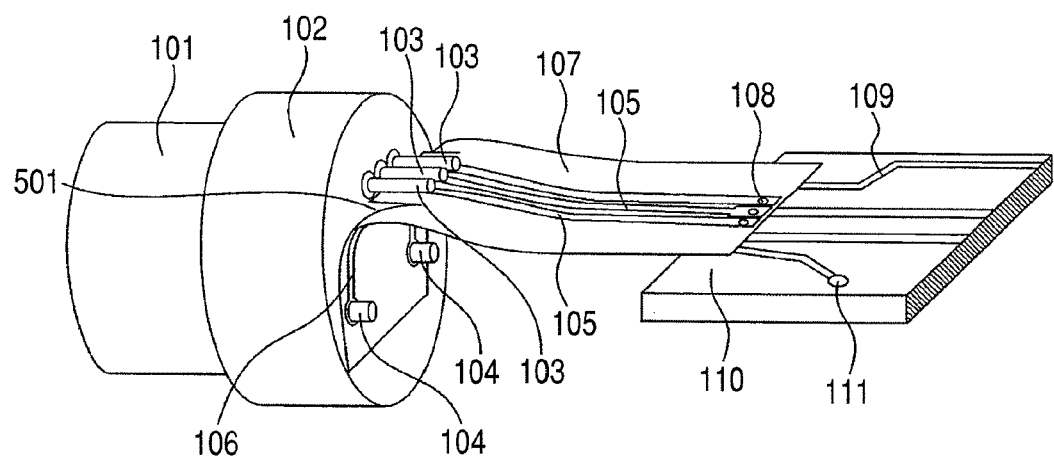
FIG. 23 is a perspective view showing another optical semiconductor device according to the tenth embodiment of the invention.
Figure 24:
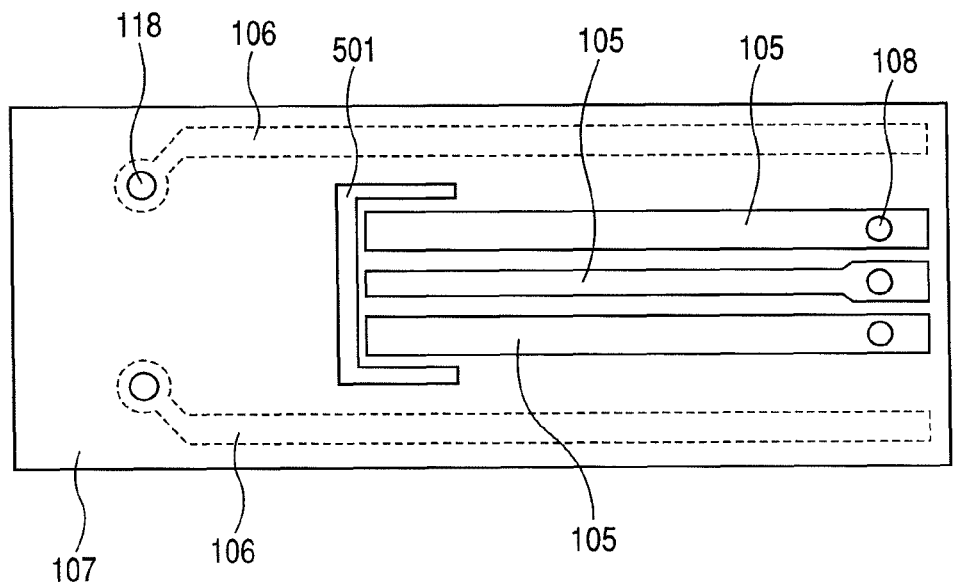
FIG. 24 is a top view of a flexile substrate according to the tenth embodiment of the invention.

FIG. 23 is a perspective view showing another optical semiconductor device according to the present embodiment, and FIG. 24 is a top view of a flexible substrate 107 of the optical semiconductor device. A third hole 501 is in such a shape as to surround a portion of each of first metal patterns 105 from three directions. In this case, there is gained an advantage in that the end of the first metal pattern 105 can be brought close to the root portion of a first lead pin 103 without abruptly bending the flexile substrate 107.

Eleventh Embodiment

Figure 25:
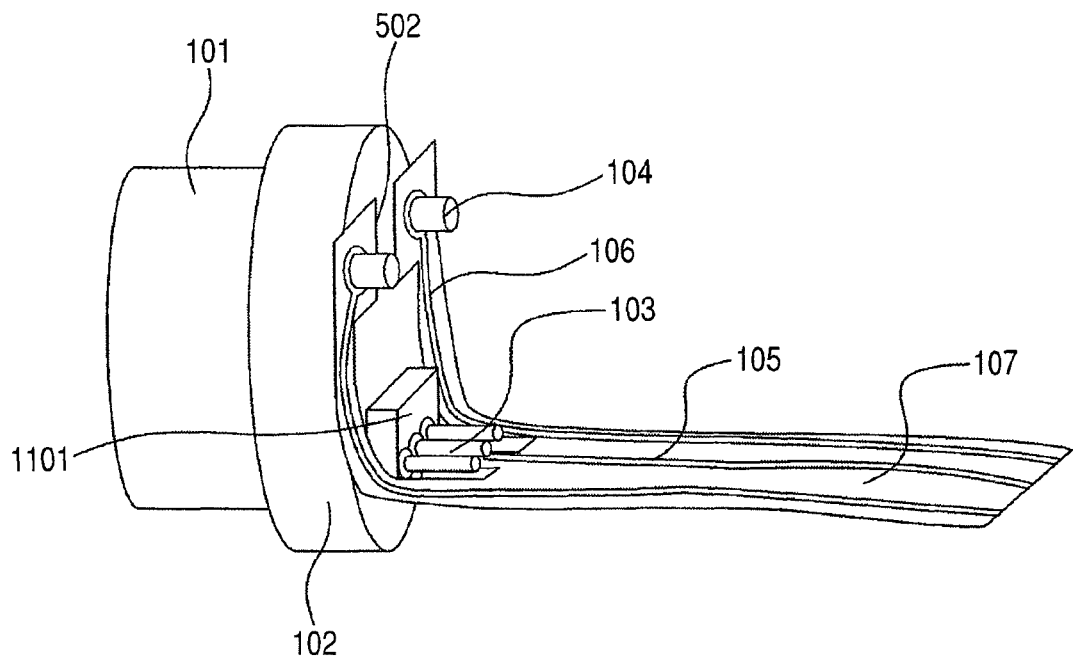
FIG. 25 is a perspective view of an optical semiconductor device according to an eleventh embodiment of the invention.
Figure 26:
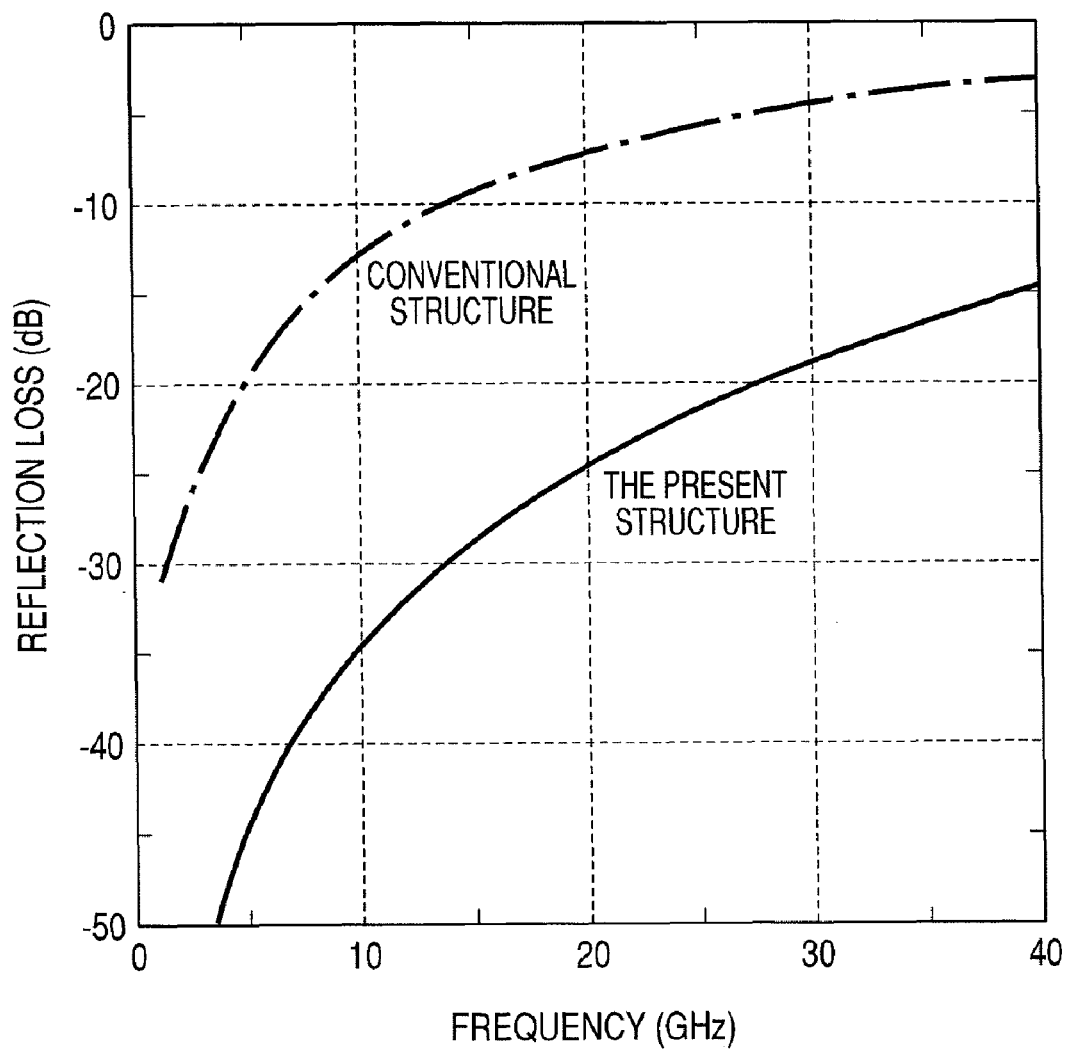
FIG. 26 is a graph showing an advantageous effect of the present invention.
Figure 27A:
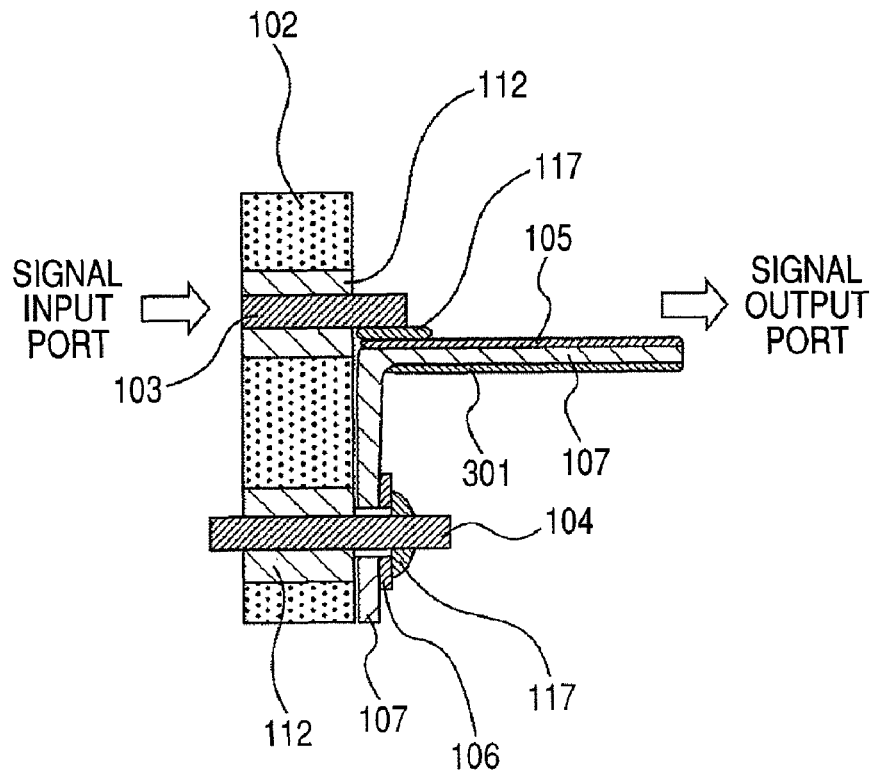
FIG. 27A is a sectional view for use in confirming the advantageous effect of the present invention.
Figure 27B:
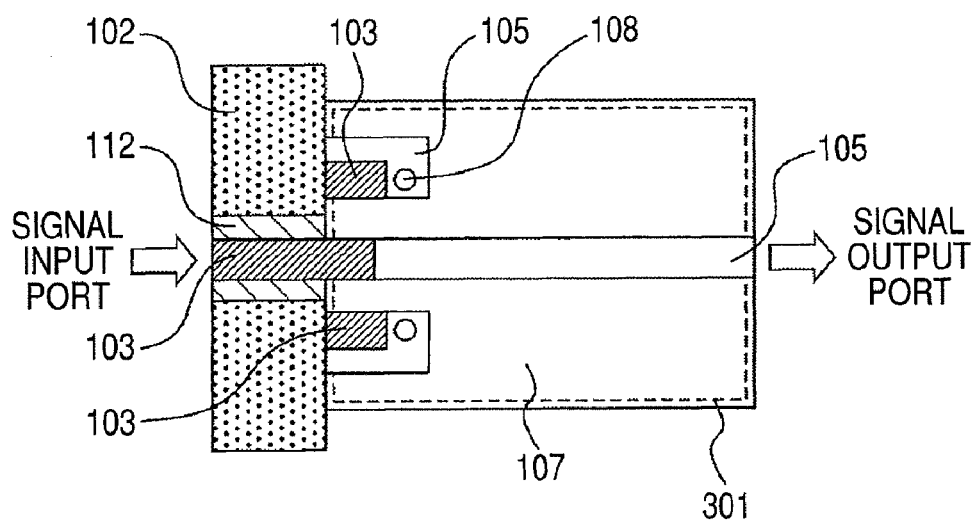
FIG. 27B is another sectional view for use in confirming the advantageous effect of the present invention.

FIG. 25 is a perspective view of an optical semiconductor device according to an eleventh embodiment of the invention. A mount 1101 is attached to a stem 102, and first lead pins 103 are attached to the mount 1101. Further, a flexile substrate 107 is provided with a second notch 502, and the mount 1101 is positioned within the second notch 502. With the optical semiconductor device, a height of the first lead pin 103 at a position where the first lead pin 103 is attached to the mount 1101 is greater than a height of a second lead pin 104 at a position where the second lead pin 104 is attached to the stem 102. Such a structure has an advantage in that it is possible to bring the root portion of each of the first lead pins 103 close to an end of each of the first metal patterns 105 even when a curvature radius of a bend of the flexile substrate 107 is rendered longer. More specifically, transmission of high frequency signal can be improved by so doing while rupture, and so forth of second metal patterns 106 can be avoided.

Thus, it is possible to provide an optical semiconductor device using a CAN type optical package in widespread use in the optical communication sector, wherein a flexible substrate, and a CAN type optical package are solidly joined with each other, the optical semiconductor device being excellent in high-frequency characteristics because of reduction in reflection of a high frequency signal, occurring to joints.

What is claimed is:

1. An optical semiconductor device comprising:
   a CAN type optical package with a plurality of lead pins attached thereto, the plurality of the lead pins extending in a direction normal to the bottom of a stem; and
   a flexible substrate provided with a plurality of electric conductors fixedly attached to the plurality of the lead pins for electrical continuity therebetween, wherein the flexible substrate has a first main surface with a first region where at least one electric conductor of the plurality of electric conductors is provided, and a second region where the at least one electric conductor is not provided, the second region is beyond a longitudinal end of the at least one electric conductor, the flexible substrate is bent in the vicinity of a boundary between the first region and the second region so as to form a substantially right angle with the bottom of the stem, the second region is positioned along the bottom of the stem and fixedly attached thereto, and at least one lead pin, among the plurality of the lead pins, is fixedly attached to a surface of the at least one electric conductor respectively, for electrical continuity therewith, and in a posture in which the at least one lead pin and the surface of the at least one electric conductor are substantially parallel to each other.

2. An optical semiconductor device comprising:
   a CAN type optical package with a plurality of lead pins attached thereto, the plurality of the lead pins extending in a direction normal to the bottom of a stem, and including first lead pins and second lead pins; and
   a flexible substrate provided with a plurality of metal patterns fixedly attached to the plurality of the lead pins, respectively, for electrical continuity therebetween, wherein the flexible substrate has a first main surface with a first region where a first metal pattern of the plurality of metal patterns is provided, and a second region where the first metal pattern is not provided, the second region is beyond a longitudinal end of the first metal pattern, a second metal pattern is provided either on the first main surface or a second main surface of the flexible substrate opposite the first main surface, the flexible substrate is bent in the vicinity of a boundary between the first region and the second region so as to form a substantially right angle with the bottom of the stem, the second region is positioned along the bottom of the stem and fixedly attached thereto, the first lead pins are fixedly attached to surface portions of the first metal pattern so as to be in a posture substantially parallel thereto, and the second lead pins are penetrated through respective first holes provided in the flexible substrate to be fixedly attached to the second metal pattern, for electrical continuity therebetween.

3. The optical semiconductor device according to claim 2, wherein at least a portion of the second metal pattern is present either on the first main surface in the first region or on the second main surface in a region opposite the first region.

4. The optical semiconductor device according to claim 2, wherein a portion of the first lead pins is used for propagation of a high frequency signal, and the second lead pins are used for power supply, grounding, and propagation of a low frequency signal.

5. The optical semiconductor device according to claim 2, wherein the flexible substrate has a first notch or a second hole, provided in the vicinity of the boundary between the first region and the second region, and the flexible substrate is bent at the substantially right angle in the vicinity of the first notch or the second hole.

6. The optical semiconductor device according to claim 2, wherein a metal pattern large in width, for power supply or grounding, is provided on the second main surface, and one end of the metal pattern for grounding is positioned in the vicinity of an area where the flexible substrate is bent at the substantially right angle.

7. The optical semiconductor device according to claim 2, wherein the second metal pattern has narrower portions located in an area where the flexible substrate is bent at the substantially right angle.

8. The optical semiconductor device according to claim 2, wherein the flexible substrate is provided with a second notch having a side thereof, located in the vicinity of the boundary, or a third hole, and the first metal pattern is provided so as to extend close to one end of the second notch, or close to one edge of the third hole while the first metal pattern is fixedly attached to the first lead pins for electrical continuity in a posture substantially parallel to each other.

9. The optical semiconductor device according to claim 2, wherein the first metal pattern of the flexible substrate has a portion larger in width than one of the first lead pins, in an area of the flexible substrate where the one of the first lead pins is fixedly attached thereto.

10. The optical semiconductor device according to claim 2, wherein the second metal pattern has a portion large in width in the vicinity of a location where the flexible substrate is bent.

11. The optical semiconductor device according to claim 2, wherein a portion of a resin layer for covering metal patterns, provided on the flexible substrate, is removed in the vicinity of a location where the where the flexible substrate is bent.

12. The optical semiconductor device according to claim 2, wherein the second metal pattern on the flexible substrate is fixedly attached to solder in the vicinity of a location where the flexible substrate is bent.

13. The optical semiconductor device according to claim 2, wherein the second metal pattern on the flexible substrate is covered with a resin layer in the vicinity of a location where the flexible substrate is bent.

14. The optical semiconductor device according to claim 2, wherein a height of one or more first lead pins from the bottom of the stem is set greater than a height of one or more of the second lead pins from the bottom of the stem.

15. An optical semiconductor device comprising:
   a CAN type optical package with at least one first lead pin attached thereto, the at least one first lead pin extending in a direction normal to the bottom of a stem; and a flexible substrate provided with a metal pattern fixedly attached to the first lead pin for electrical continuity therebetween, wherein the stem is comprised of a plurality of ceramic layers as stacked, an electrode pad with a metal pattern patterned thereon is provided on respective surfaces of the ceramic layers, the ceramic layers each are electrically connected to the electrode pad through the intermediary of a via hole to be thereby electrically connected to the first lead pin, and the flexible substrate has a first main surface with a first region where a first metal pattern is provided, and a second region where the first metal pattern is not provided, the second region is beyond a longitudinal end of the first metal pattern, while a second metal pattern is provided either on the first main surface or a second main surface of the flexible substrate opposite the first main surface, the flexible substrate is bent in the vicinity of a boundary between the first region and the second region so as to form a substantially right angle with the bottom of the stem, the second region is positioned along the bottom of the stem and fixedly attached thereto, the first lead pin is fixedly attached to a surface of the first metal pattern so as to be in a posture substantially parallel thereto, and the electrode pad is fixedly attached to the second metal pattern for electrical continuity therebetween.

16. The optical semiconductor device according to claim 15, wherein a portion of the first lead pin at a joint with the stem has a relatively greater sectional thickness.

17. The optical semiconductor device according to claim 15, wherein the first metal pattern of the flexible substrate has a portion larger in width than a width of the first lead pin, at a location where the first lead pin is fixedly attached thereto.

18. The optical semiconductor device according to claim 15, wherein the second metal pattern has a portion relatively large in width, in the vicinity of a location where the flexible substrate is bent.

19. The optical semiconductor device according to claim 15, wherein a portion of a resin layer for covering metal patterns, provided on the flexible substrate, is removed in the vicinity of a location where the flexible substrate is bent.

20. The optical semiconductor device according to claim 15, wherein the second metal pattern on the flexible substrate is fixedly attached to solder in the vicinity of a location where the flexible substrate is bent.

21. The optical semiconductor device according to claim 15, wherein the second metal pattern on the flexible substrate is covered with a resin layer in the vicinity of a location where the flexible substrate is bent.

22. The optical semiconductor device according to claim 15, wherein a height of the first lead pin from the bottom of the stem is greater than a height of a second lead pin from the bottom of the stem.

* * * * *